(12) United States Patent
Yoshinaga

(10) Patent No.: US 8,143,698 B2
(45) Date of Patent: Mar. 27, 2012

(54) SEMICONDUCTOR DEVICE

(75) Inventor: Chikashi Yoshinaga, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 12/535,282

(22) Filed: Aug. 4, 2009

(65) Prior Publication Data

US 2010/0006980 A1  Jan. 14, 2010

Related U.S. Application Data

(62) Division of application No. 11/699,336, filed on Jan. 30, 2007, now abandoned.

(30) Foreign Application Priority Data

Jan. 31, 2006  (JP) .................................. 2006-022842

(51) Int. Cl.
*H01L 29/92* (2006.01)

(52) U.S. Cl. . 257/532; 257/306; 257/309; 257/E29.343; 257/E21.012; 438/239; 438/253; 438/396

(58) Field of Classification Search .................. 257/532, 257/E29.343, 306, 309, E21.012; 438/239, 438/253, 396

See application file for complete search history.

(56) References Cited

U.S. PATENT DOCUMENTS

| | | | |
|---|---|---|---|
| 6,894,331 B2 | 5/2005 | Yoshitomi et al. | |
| 6,982,200 B2 | 1/2006 | Noguchi et al. | |
| 6,982,453 B2 * | 1/2006 | Kanaya et al. | 257/306 |
| 2002/0187604 A1 * | 12/2002 | Inaba | 438/239 |
| 2005/0161725 A1 | 7/2005 | Da Dalt | |
| 2009/0236648 A1 * | 9/2009 | Maeda et al. | 257/296 |

FOREIGN PATENT DOCUMENTS

| | | |
|---|---|---|
| JP | 2000-260939 | 9/2000 |
| JP | 2001-237375 | 8/2001 |
| JP | 2004-214550 | 7/2004 |

OTHER PUBLICATIONS

Notice of Reasons for Rejection issued by the Japanese Patent Office on Nov. 1, 2011 in corresponding Japanese Patent Application No. 2006-022842 with partial English Translation, 6 pages.

* cited by examiner

*Primary Examiner* — Cuong Q Nguyen
*Assistant Examiner* — Cathy N Lam
(74) *Attorney, Agent, or Firm* — Young & Thompson

(57) ABSTRACT

A problem of an increased manufacturing cost is caused in conventional semiconductor devices. A semiconductor device 1 includes: a lower electrode 102 provided on a semiconductor substrate 101; an insulating film 105, provided on the lower electrode 102 so as to be in contact with the lower electrode 102; an upper electrode 103, provided on the insulating film 105 so as to be in contact with the insulating film 105; an opening portion 121, provided in the lower electrode 102 and extending through the lower electrode 102; and an opening portion 122, provided in the upper electrode 103 and extending through the upper electrode 103. The insulating film 123 is embedded in the opening portion 121 that is provided in the lower electrode 102. Similarly, the insulating film 124 is embedded in the opening portion 122 that is provided in the upper electrode 103.

3 Claims, 19 Drawing Sheets

SEMICONDUCTOR DEVICE

This application is based on Japanese patent application No. 2006-22,842, the content of which is incorporated hereinto by reference.

BACKGROUND

1. Technical Field

The present invention relates to a semiconductor device.

2. Related Art

In recent years, developments in large scale integrated circuits (LSI) having analog-circuits (analog devices) and digital circuits (digital devices) integrated in one chip is progressed. Among these technical trends, miniaturizations of digital devices are progressed year by year, in which a reduced gate length in a metal oxide semiconductor (MOS) transistor of on the order of about 0.1 μm was achieved, and in such situation, copper (Cu), which is a low resistivity material, has widely been employed for an interconnect material, for the purpose of providing a reduced interconnect resistance, and a damascene process has been employed for forming the interconnects.

Meanwhile, capacitor elements are critical components for analog circuits. While a capacitor element has been conventionally configured to have a polysilicon layer or an impurity diffusion layer employed as an electrode, a type of a capacitor element so called metal-insulator-metal (MIM) capacitor newly attracts attention in recent years. The MIM capacitor is a capacitor element, which is configured by providing an insulating film sandwiched between electrodes that are composed of a metal, and draws much attention since the MIM capacitor is capable of providing an improved frequency characteristics. When Cu is employed for an interconnect material, Cu is also often employed for an electrode of a MIM capacitor.

Nonetheless, when an electrode of a MIM capacitor is formed via a damascene process employing Cu for a material of the process, a problem of a dishing (phenomenon of causing positional variation in polishing-ability in a planarizing operation of a Cu interconnect via a chemical mechanical polishing (CMP) process, and more specifically a center of an interconnect is more considerably polished as compared with both ends of the interconnect, leading to a locally thinner interconnect film in the center) is caused, so that a process for forming the MIM capacitor without causing an issue of the dishing is expected. In particular, since degree of integration in a transistor is increasingly improved as levels of the miniaturization is increased, a critical issue is how the capacitor elements in an analog circuit would be formed to have higher capacity without disturbing higher integration level of devices. In addition, since characteristics of the integrated analog circuits are increasingly improved, a formation of capacitor elements with less variation of capacities is a critical problem for the purpose of providing improved characteristics of analog circuits.

A conventional structure for preventing such issue of dishing caused in the process for forming the electrode in the MIM capacitor is described in Japanese Patent Laid-Open No. 2001-237,375. FIG. 18 illustrates a plan view of a MIM capacitor disclosed in Japanese Patent Laid-Open No. 2001-237,375. FIG. 19 is a cross-sectional view along line A-A' of FIG. 18. In the semiconductor substrate 211, a lattice-shaped trench is formed, and the interior of this trench is filled with a metallic film 212 composed of a metallic material having lower resistance (for example, Cu). The metallic film 212 filling the interior of the trench in the semiconductor substrate 211 serves as a first electrode of the MIM capacitor. While the layout of the first electrode in the MIM capacitor is designed to be lattice-shaped, such layout is for solving the issue of the dishing in the damascene process.

A silicon nitride (SiN) film 213 is formed on the semiconductor substrate 211 except a region to be provided with a capacitor of the MIM capacitor. The region to be provided with a capacitor of the MIM capacitor forms a groove surrounded by the walls of the silicon nitride film 213. Then, a tungsten nitride (WN) film 214 is formed in the region to be provided with a capacitor of the MIM capacitor. The tungsten nitride film 214 functions as a diffusion barrier film for the metallic film 212, and also functions as increasing the capacitor area by being disposed above the lattice-shaped first electrode.

A capacitor insulating film (for example, tantalum oxide ($Ta_2O_5$) film) 215 is formed on the tungsten nitride film 214. A tungsten nitride (WN) film 216 is formed on the capacitor insulating film 215. The tungsten nitride film 216 functions as a diffusion barrier film for a metallic material (for example, Cu) serving as a second electrode of the MIM capacitor as described later and also functions as increasing the capacitor area by being disposed under the lattice-shaped second electrode.

A silicon nitride (SiN) film 217 is formed on the tungsten nitride film 216. The silicon nitride film 217 functions as an etch stop film in the etch process (i.e., in the process for forming trench), together with the silicon nitride film 213.

A silicon oxide ($SiO_2$) film 218 is formed on the silicon nitride films 213 and 217, and a silicon nitride film 219 is formed on the silicon oxide film 218. The silicon nitride film 219 functions as an etch stop film in the process for forming the trench in the ducal damascene process. A silicon oxide ($SiO_2$) film 220 is formed on the silicon nitride film 219, and a silicon nitride film 221 is formed on the silicon oxide film 220. The silicon nitride film 221 functions as an etch stop film in the CMP process.

A lattice-shaped trench, or a trench for an interconnect or a pad, for example, is formed within the silicon oxide film 220 (portion thereof above the silicon nitride film 219). In addition, trenches (via holes) that reach to the metallic film 212 or the tungsten nitride film 216 are formed in the silicon oxide film 218 and the silicon nitride film 213. The interior of these trenches are filled with metallic films 222A and 222B, which are composed of a metallic material having lower resistance and larger diffusion constant (for example, Cu). The metallic film 222A filling the interior of the trench serves as a second electrode of the MIM capacitor.

However, an issue of increasing a manufacturing cost described as follows may be caused in such technique. More specifically, while the first electrode of the MIM capacitor composed of the metallic film 212 is formed to be lattice-shaped, the tungsten nitride film 214 is formed to be flat-shaped in the region to be provided with capacitors. In addition, while the tungsten nitride film 216 is formed to be flat-shaped on the capacitor insulating film 215, the second electrode of the MIM capacitor composed of the metallic film 222A is formed to be lattice-shaped.

Since the tungsten nitride films 214 are 216 are formed under and above the capacitor insulating film 215, respectively, the tungsten nitride films 214 and 216 substantially constitutes electrodes of the MIM capacitor. As described above, the operation for forming the metallic films 212 and 222A to be lattice-shaped and the operation for forming the tungsten nitride films 214 and 216 to be flat-shaped are required to form the electrodes of the MIM capacitor, leading to a problem of an increased number of the process operations and thus an increased manufacturing cost.

SUMMARY OF THE INVENTION

According to one aspect of the present invention, there is provided a semiconductor device, comprising: a first electrode provided on a semiconductor substrate; a capacitive film, provided on the first electrode so as to be in contact with the first electrode; a second electrode, provided on the capacitive film so as to be in contact with the capacitive film, the second electrode, the first electrode and the capacitive film constituting a capacitor element; a first opening portion, provided in the first electrode and extending through the first electrode; and a second opening portion, provided in the second electrode and extending through the second electrode, wherein an insulating film is embedded within the first opening portion and the second opening portion.

The semiconductor device is configured that the first and the second opening portions are provided in the first and the second electrodes, respectively. The device is also configured that the insulating films are embedded in the opening portions. Such configuration provides a structure, in which the above-described insulating films are exposed in portions of the surfaces of the first and the second electrodes. Having such configuration, a generation of a dishing can be inhibited in such process for manufacturing the semiconductor devices.

Further, the first and the second opening portions extend through the first and the second electrodes, respectively. More specifically, the first and the second opening portions are provided over the whole of the first and the second electrodes along a vertical direction (direction to be normal to the substrate surface of the semiconductor substrate), respectively. Consequently, unlikely as the semiconductor device described in the above-described Japanese Patent Laid-Open No. 2001-237,375, an increase of a manufacturing cost can be inhibited.

According to the present invention, a semiconductor device, which is capable of providing a solution for the issue of dishing, can be achieved while inhibiting an increase of the manufacturing cost.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, an identical numeral is assigned to an element commonly appeared in the figures, and the detailed description thereof will not be repeated.

First Embodiment

Figure 1:
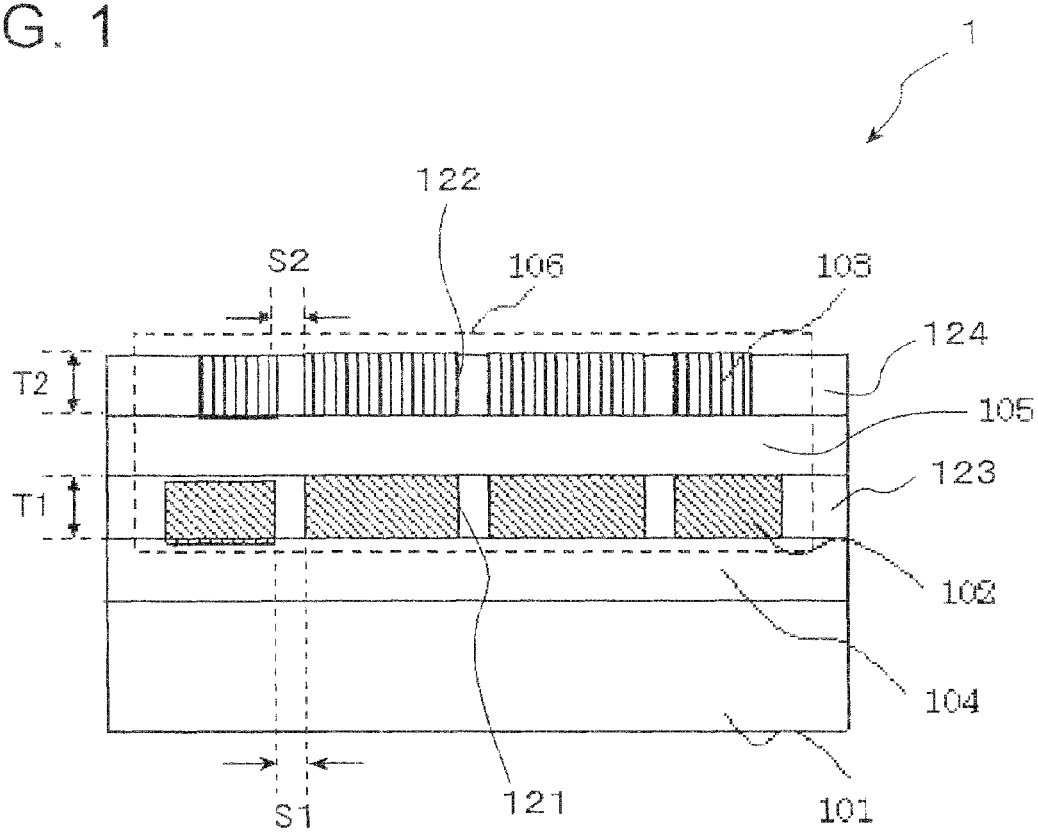
FIG. 1 is a cross-sectional view, illustrating first embodiment of a semiconductor device according to the present invention.
Figure 2:
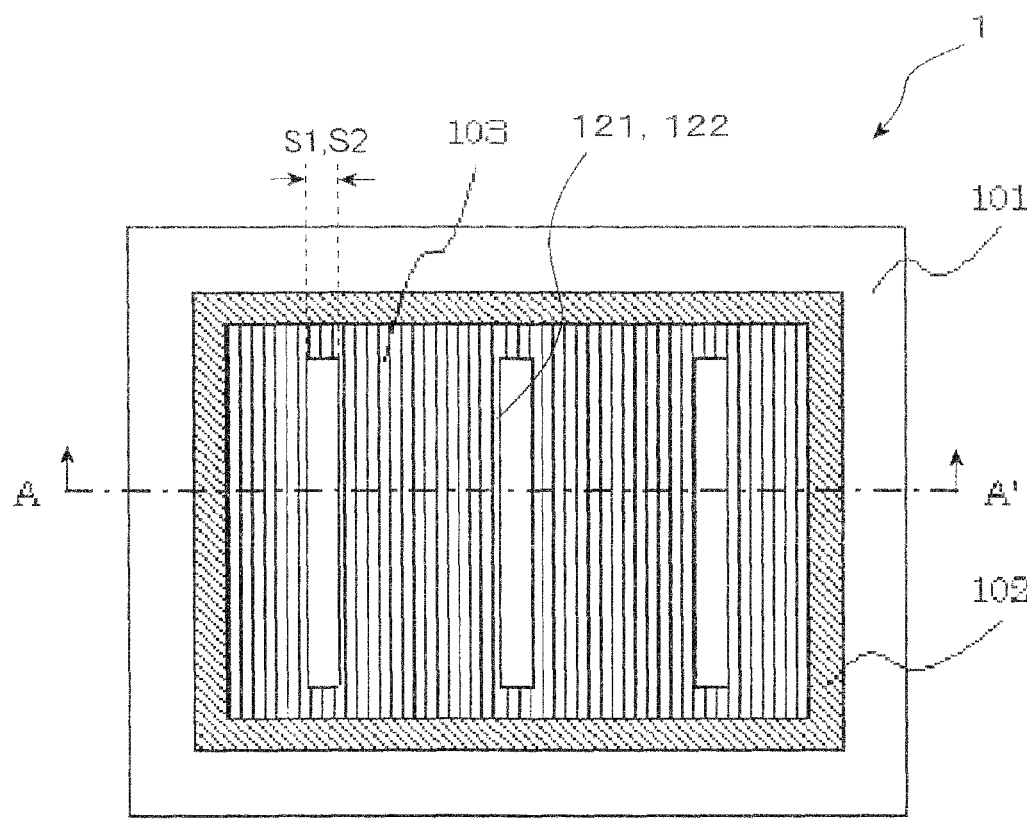
FIG. 2 is a plan view, illustrating the semiconductor device of FIG. 1.

FIG. 1 is a cross-sectional view, illustrating first embodiment of a semiconductor device according to the present invention. FIG. 2 is a plan view, illustrating the semiconductor device of FIG. 1. The cross section along line A-A' in FIG. 2 corresponds to the cross-sectional view of FIG. 1. A semiconductor device 1 includes:

a lower electrode 102 (first electrode) provided on a semiconductor substrate 101;

an insulating film 105 (capacitive film), provided on the lower electrode 102 so as to be in contact with the lower electrode 102;

an upper electrode 103 (second electrode), provided on the insulating film 105 so as to be in contact with the insulating film 105;

a opening portion 121 (first opening portion), provided in the lower electrode 102 and extending through the lower electrode 102; and a opening portion 122 (second opening portion), provided in the upper electrode 103 and extending through the upper electrode 103.

The semiconductor substrate 101 may be, for example, a p-type silicon substrate.

An insulating film 104, an insulating film 123, an insulating film 105 and an insulating film 124 are sequentially deposited on the semiconductor substrate 101. A silicon dioxide ($SiO_2$) film may be, for example, employed for these insulating films 104, 105, 123 and 124. The lower electrode 102 and the upper electrode 103 are formed in the insulating film 123 and in the insulating film 124, respectively. The lower electrode 102 and the upper electrode 103 are formed as metallic films such as Cu film or the like. The lower electrode 102 and the upper electrode 103 may be formed via, for example, a damascene process. It is configured that the insulating film 123 is embedded in the opening portion 121 that is provided in the lower electrode 102. Similarly, it is configured that the insulating film 124 is embedded in the opening portion 122 that is provided in the upper electrode 103.

The lower electrode 102 and the upper electrode 103 are flat plate-shaped, which are in a mutually parallel relationship. The lower electrode 102 and the upper electrode 103, together with the insulating film 105 interposing therebetween, constitute a capacitor element 106. Such capacitor element 106 is a MIM capacitor.

As shown in FIG. 2, the opening portion 121 and the opening portion 122 are slit-shaped in plan view. In particular in the present embodiment, the opening portion 121 is identical to the opening portion 122, in terms of geometry, dimension and position. More specifically, an orthogonal projection of the opening portion 121 to a plane that is parallel with the substrate surface of the semiconductor substrate 101 is identical to an orthogonal projection of the opening portion 122 to the above-described plane.

Here, it is preferable that a width S1 of the opening portion 121 is equal to or shorter than a thickness T1 of the lower electrode 102. Similarly, it is preferable that a width S2 of the opening portion 122 is equal to or shorter than a thickness T2 of the upper electrode 103. In the present embodiment, S1 equal to S2. In addition to above, when the opening portion is slit-shaped, a width of the opening portion may be defined as a length thereof along a direction perpendicular to a longitudinal direction of the slit in plan view (see FIG. 2).

Subsequently, an advantageous effect obtainable by employing the configuration of the semiconductor device 1 will be described. In the semiconductor device 1, the opening portion 121 and the opening portion 122 are provided in the lower electrode 102 and in the upper electrode 103, respectively. The insulating film 123 and the insulating film 124 are embedded in the opening portion 121 and the opening portion 122, respectively. Therefore, the insulating film 123 and the insulating film 124 are exposed in portions of the surfaces of the lower electrode 102 and the upper electrode 103, respectively. Having such configuration, a generation of a dishing can be inhibited in the process for manufacturing the semiconductor device 1.

Further, the opening portion 121 and the opening portion 122 extend through the lower electrode 102 and the upper electrode 103, respectively. More specifically, the opening portion 121 and the opening portion 122 are provided over the whole of the lower electrode 102 and the upper electrode 103 along a vertical direction (direction to be perpendicular to the substrate surface of the semiconductor substrate 101), respectively. Consequently, unlikely as the semiconductor device described in the above-described Japanese Patent Laid-Open No. 2001-237,375, an increase of a manufacturing cost can be inhibited. Therefore, the semiconductor device 1, which is capable of providing a solution for the issue of dishing, can be achieved while inhibiting an increase of the manufacturing cost.

Figure 3:
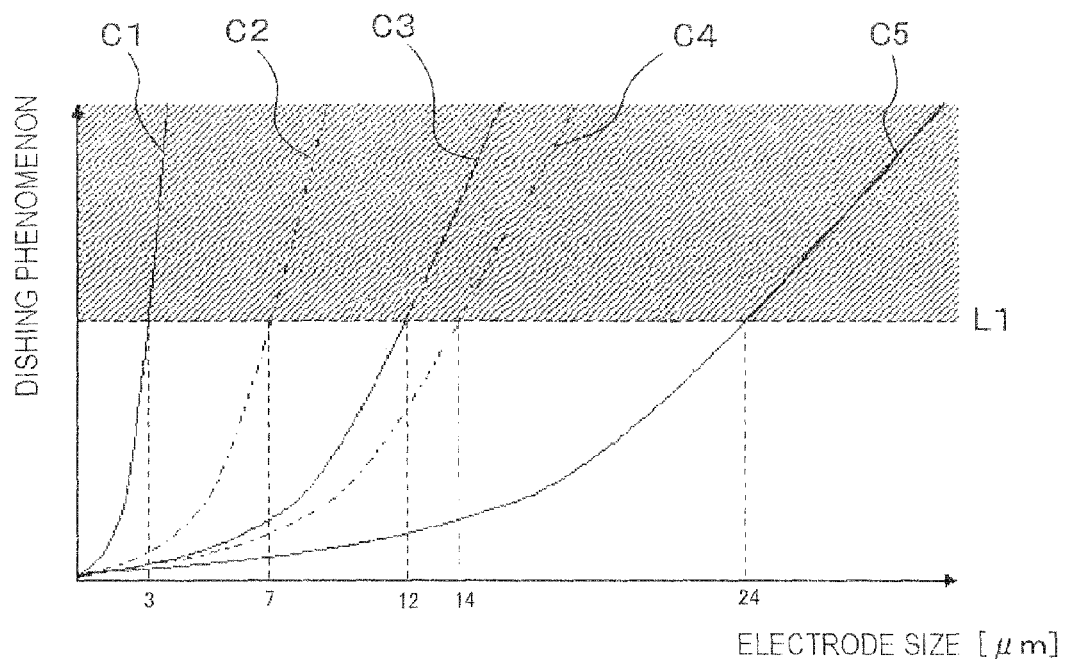
FIG. 3 is a graph, useful in describing an advantageous effect of the semiconductor device of FIG. 1.

FIG. 3 is a graph, showing a relationship of a dishing phenomenon with a size of an electrode. Abscissa represents a size of an electrode [μm], and ordinate represents a level of a dishing. Lines C1 to C5 correspond to respective cases described as follows. The slits described here correspond to the above-described opening portions 121 and 122. In addition, line L1 indicates the tipper limit of a level of a dishing phenomenon tolerated in the manufacturing process. More specifically, it is meant that a non-defective semiconductor device can not be obtained if a dishing of a level beyond the line L1 is created.

C1: no slit
C2: one slit (0.2 μm-wide)
C3: one slit (0.4 μm-wide)
C4: two slits (each 0.2 μm-wide)
C5: two slits (each 0.4 μm-wide)

As can be seen from FIG. 3, larger size of the electrode provides larger level of the dishing phenomenon. Under such circumstances, if the level of the dishing phenomenon exceeds a certain limit (line L1), a height of a step created in the metallic film by the dishing phenomenon is excessively increased, so that processes after the next operation can not be normally conducted, eventually preventing the products from being manufactured as non-defective products. The present exemplary implementation shows that, when no slit is included (see line C1), a size of an electrode can only be increased up to 3 μm, and therefore the capacitance of the formed capacitor is considerably small. On the contrary, it can also be understood that the configuration including slits provides moderating the level of the dishing phenomenon, thereby increasing the size of the electrode formed in the process. For example, when two slits having widths of 0.4 μm is formed, (see line C5), the designed size of the electrode can be increased up to 24 μm.

Figure 4:
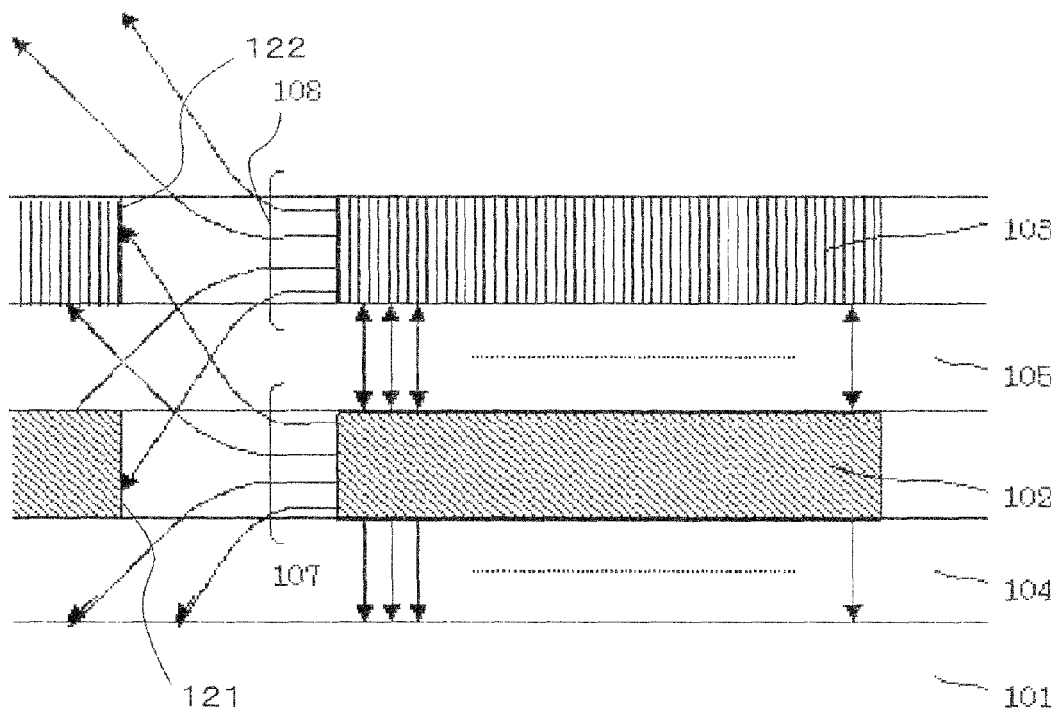
FIG. 4 is a cross-sectional view of the semiconductor device, useful in describing an advantageous effect of the semiconductor device of FIG. 1.

FIG. 4 shows a schematic diagrams, illustrating mock-ups of electric flux line generated from the lower electrode 102 of the capacitor element 106 and electric flux line generated from the upper electrode 103, in the case that the width of the opening portion 121 and the width of the opening portion 122 are larger than the thickness of the lower electrode 102 and the thickness of the upper electrode 103, respectively. Arrows 107 and arrows 108 represent electric flux line generated from side surfaces of the lower electrode 102 and from side surfaces of the upper electrode 103, respectively. As can be seen from FIG. 4, larger amount of electric flux line leak out from the slits (opening portions 121 and 122) in this case, and thus it is appeared that the configuration is electrically equivalent to a configuration, in which a plurality of isolated smaller electrodes are arranged. When the size of electrodes is smaller, a geometric variation of the formed electrodes is increased, providing an increased variation in capacitance, leading to deteriorating characteristics of analog circuits.

Figure 5:
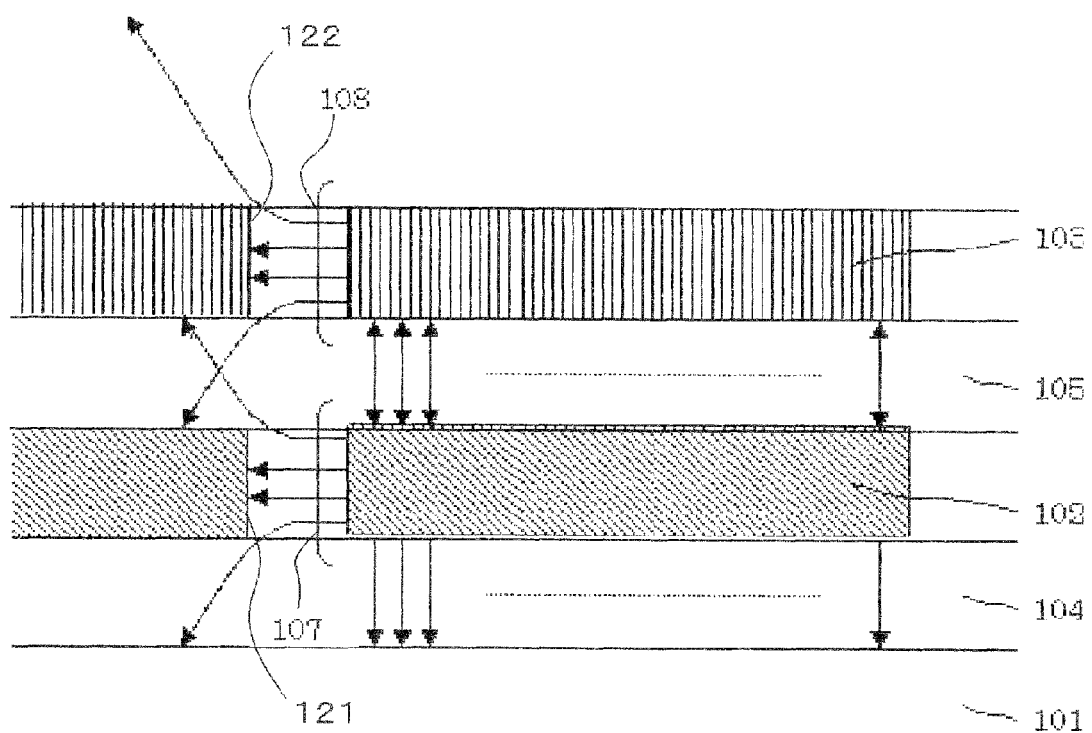
FIG. 5 is a cross-sectional view of the semiconductor device, useful in describing an advantageous effect of the semiconductor device of FIG. 1.

FIG. 5 shows a schematic diagrams, illustrating mock-ups of electric flux line generated from the lower electrode 102 of the capacitor element 106 and electric flux line generated from the upper electrode 103, in the case that the width of the opening portion 121 and the width of the opening portion 122 are equal to or smaller than the thickness of the lower electrode 102 and the thickness of the upper electrode 103, respectively. As can be seen from FIG. 5, smaller amount of electric flux line leak out from the slits (opening portions 121 and 122) in this case, and thus it is appeared that the configuration is electrically equivalent to a configuration, in which no slit is included therein, and one larger electrode is included. When the size of electrodes is larger, a geometric variation of the formed electrodes is decreased, providing a reduced variation in capacitance, thereby leading to maintaining better characteristics of analog circuits.

Figure 6:
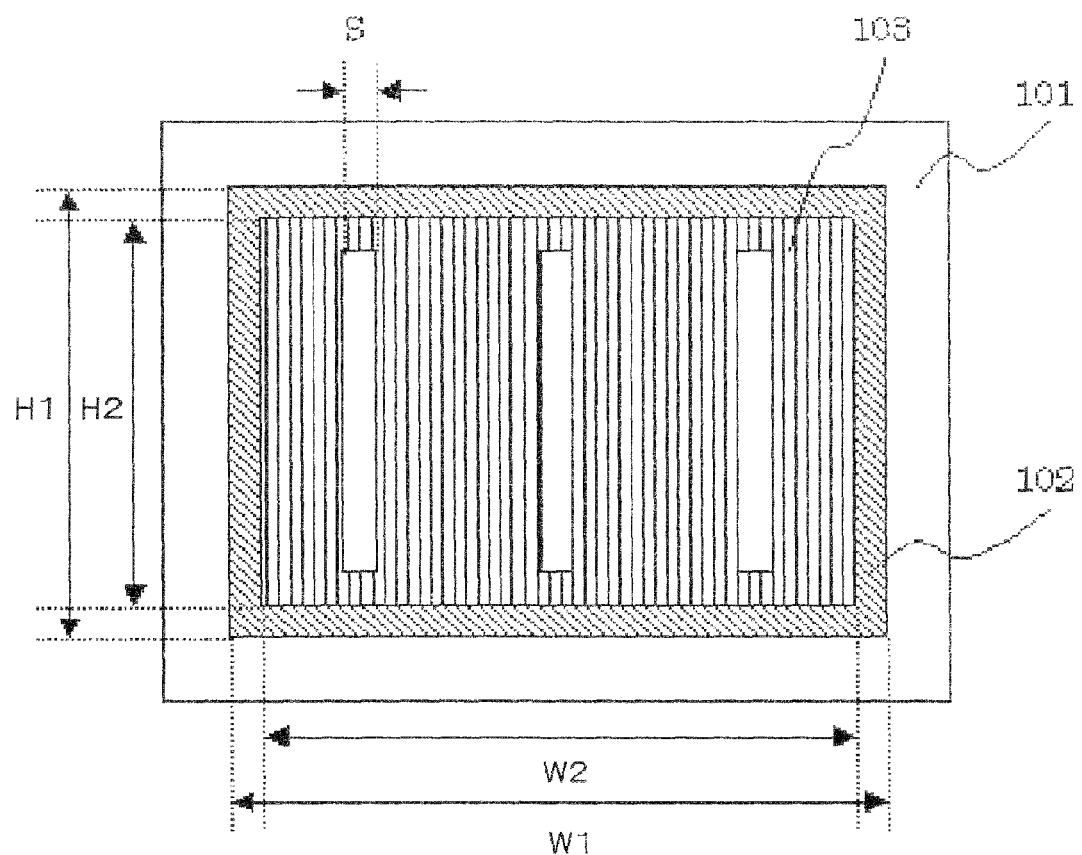
FIG. 6 is a plan view of the semiconductor device, useful in describing an advantageous effect of the semiconductor device of FIG. 1.
Figure 7:
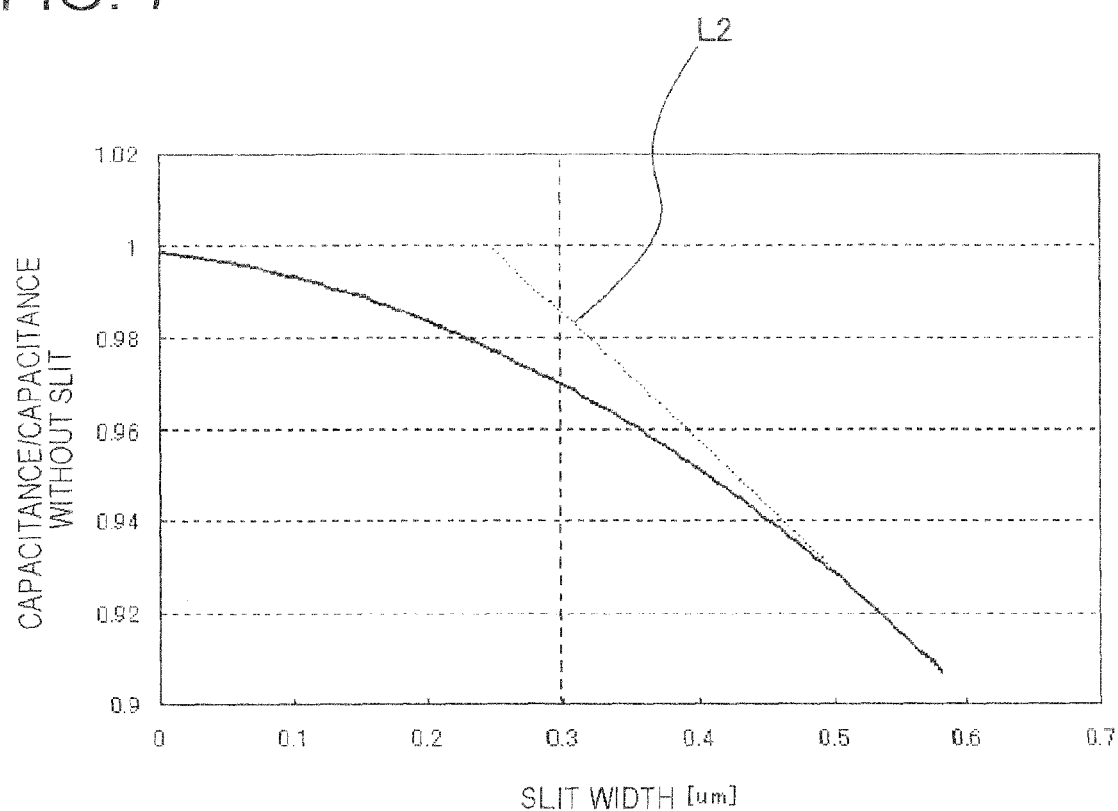
FIG. 7 is a cross-sectional view of the semiconductor device, useful in describing an advantageous effect of the semiconductor device of FIG. 1.

FIG. 6 shows a layout pattern, which is employed for obtaining a relationship of obtained capacitance values of the capacitor element 106 with slit widths S (corresponding to the above-described widths S1 and S2) via a three-dimensional capacitance simulator. In addition, FIG. 7 is a graph, showing results of the capacitance values obtained via the three-dimensional capacitance simulator. Abscissa represents a width of slit [μm] and ordinate represents a capacitance value. However, value of ordinate represents a dimensionless capacitance value obtained by a ratio of the obtained capacitance value to a capacitance value without slit (i.e., ratio of [measured capacitance value]/[capacitance value without slit]). Fixed W1 and H1, which represent outer dimension of the lower electrode 102 shown in FIG. 6 and fixed W2 and H2, which represent outer dimension of the upper electrode 103, are employed in the simulation, and the slit width S is changed.

As can be seen from FIG. 7, steeper slope of the curve representing the capacitance value (cf. straight line L2) appears when the slit width S is larger than the thickness of the electrode (0.3 μm in this embodiment), and such result is obtained because a decrease in area of the electrode by having wider slit width S just causes a reduction in capacitance value. On the contrary, gentle slope of the curve representing the capacitance value appears when the slit width S is equal to or shorter than the thickness of the electrode, and such result is obtained because a decrease in area of the electrode by having the slit is not much influenced over the capacitance value. In other words, when the slit width S is equal to or shorter than the thickness of the electrode, it can be considered that the electrode can be almost considered as having no slit.

Figure 8:
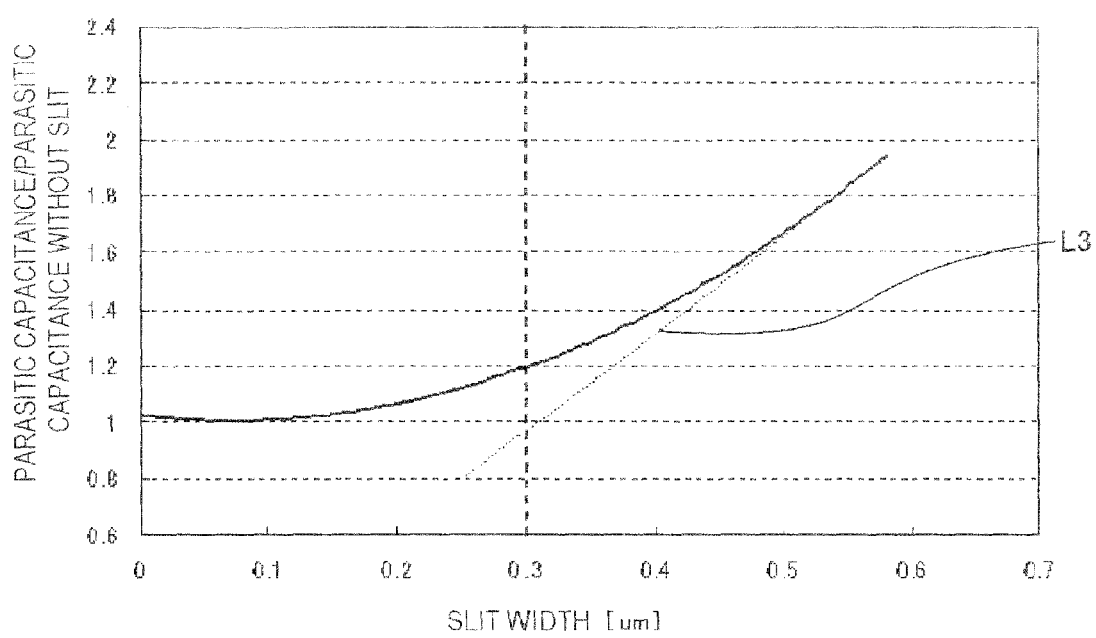
FIG. 8 is a graph, useful in describing an advantageous effect of the semiconductor device of FIG. 1.

FIG. 8 a graph showing a relationship of a parasitic capacitance caused in the upper electrode 103 of the capacitor element 106 over the semiconductor substrate 101 with the slit width S in the layout pattern of FIG. 6, obtained by employing the three-dimensional capacitance simulator. Abscissa represents a width of slit [μm], and ordinate represents a parasitic capacitance. However, value of ordinate represents a dimensionless parasitic capacitance value obtained by a ratio of the obtained parasitic capacitance value to a parasitic capacitance value without slit (i.e., ratio of [measured parasitic capacitance value]/[parasitic capacitance value without slit]). Steeper slope of the curve representing the parasitic capacitance value (cf. straight line L3) appears when the slit width S is larger than the thickness of the electrode, and such result is obtained because a increase in area of the side surface of the electrode by having wider slit width S just influences increase of parasitic capacitance value. On the contrary, gentle slope of the curve representing the parasitic capacitance value appears when the slit width S is equal to or shorter than the thickness of the electrode, and such result is obtained because a increase in area of the side surface of the electrode by having the slit is not much influenced over the parasitic capacitance value. In other words, when the slit width S is equal to or shorter than the thickness of the electrode, it can be considered that the electrode can be almost considered as having no slit.

As described above, the MIM capacitance is configured that the lower electrode 102 and the upper electrode 103 of the capacitor element 106 are provided with the opening portions (slit in this embodiment) having a width smaller than the thickness thereof, so that a prevention of an influence by a dishing and a reduction in variation of capacitance value resulting from geometric variation can be achieved, thereby providing the MIM capacitance, which is suitable for analog circuits.

In addition, in the semiconductor device 1, the opening portion 121 is identical to the opening portion 122, in terms of geometry, dimension and position. This configuration further facilitates the manufacture of the semiconductor device 1.

Second Embodiment

Figure 9:
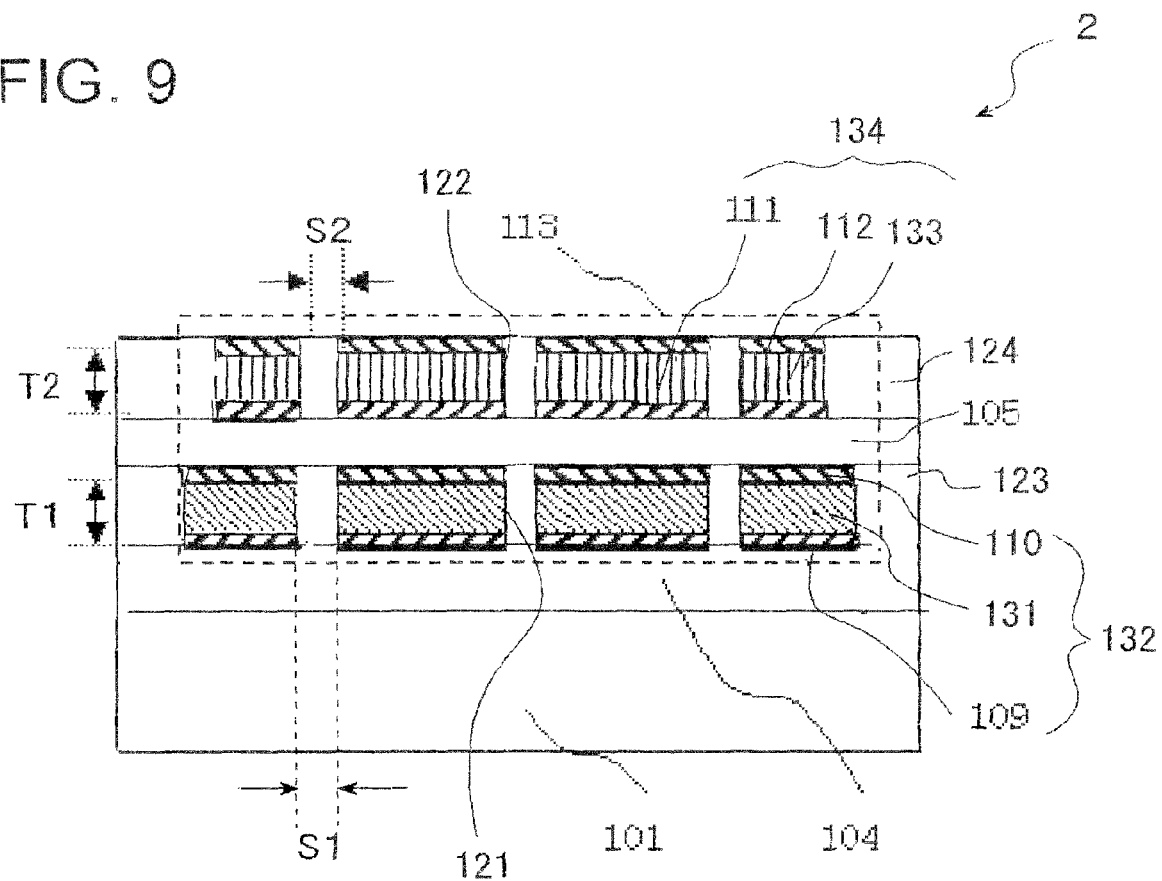
FIG. 9 is a cross-sectional view, illustrating second embodiment of a semiconductor device according to the present invention.

FIG. 9 is a cross-sectional view, illustrating second embodiment of a semiconductor device according to the present invention. A semiconductor device 2 includes:

a lower electrode 132 (first electrode) provided on a semiconductor substrate 101;

an insulating film 105 (capacitive film), provided on the lower electrode 132 so as to be in contact with the lower electrode 132;

an upper electrode 134 (second electrode), provided on the insulating film 105 so as to be in contact with the insulating film 105;

a opening portion 121 (first opening portion), provided in the lower electrode 132 and extending through the lower electrode 132; and a opening portion 122 (second opening portion), provided in the upper electrode 134 and extending through the upper electrode 134.

The lower electrode 132 is composed of a metallic film 131 and diffusion barrier films 109 and 110 covering a surface of the metallic film 131. More specifically, an upper surface and a lower surface of the metallic film 131 are covered with the diffusion barrier film 110 and the diffusion barrier film 109, respectively. The opening portion 121 extends through both of the metallic film 131 and the diffusion barrier films 109 and 110. Similarly, the upper electrode 134 is composed of a metallic film 133 and diffusion barrier films 111 and 112 covering a surface of the metallic film 133. More specifically, an upper surface and a lower surface of the metallic film 133 are covered with the diffusion barrier film 112 and the diffusion barrier film 111, respectively. The opening portion 122 extends through both of the metallic film 133 and the diffusion barrier films 111 and 112. In addition to above, the metallic films 131 and 133 are, for example, Cu films. In addition, the diffusion barrier films 109, 110, 111 and 112 are, for example, tungsten nitride films.

In the semiconductor device 2, the lower electrode 132, the upper electrode 134 and the insulating film 105 constitute a capacitor element 113. The rest of elements in the configuration of the semiconductor device 2 is similar to that of the semiconductor device 1.

The semiconductor device 2 having such configuration is capable of providing advantageous effects described below, in addition to the advantageous effects described above in reference to the semiconductor device 1. In the semiconductor device 2, the metallic film 131 is covered with the diffusion barrier films 109 and 110, and the metallic film 133 is covered with the diffusion barrier films 111 and 112. This configuration provides an effective prevention of the metallic material composing the metallic film 131 and the metallic film 133 from diffusing therein.

Moreover, the opening portion 121 extended through the diffusion barrier films 109 and 110, in addition to extending through the metallic film 131. Similarly, the opening portion 122 extended through the diffusion barrier films 111 and 112, in addition to extending through the metallic film 133. More specifically, the diffusion barrier films 109 and 110 and the diffusion barrier films 111 and 112 are provided with the slits (opening portion 121 and 122) having geometry same as the metallic film 131 and the metallic film 133, respectively. Consequently, only a smaller number of additional operations for forming the slit is required, such that an increase of the manufacturing cost can be avoided.

Meanwhile, when the opening portions are formed in both of the metallic film and the diffusion barrier film that constitutes the electrode of the MIM capacitance for avoiding an increase of the manufacturing cost as described above, a capacitance value is reduced, as compared with a case of employing an electrode provided with no opening portion. With regard to the aspect, as described above in reference to FIG. 7, a decrease of the capacitance caused by providing the opening portion can be reduced by having the width of the opening portion to be equal to or smaller than the thickness of the electrode.

Third Embodiment

Figure 10:
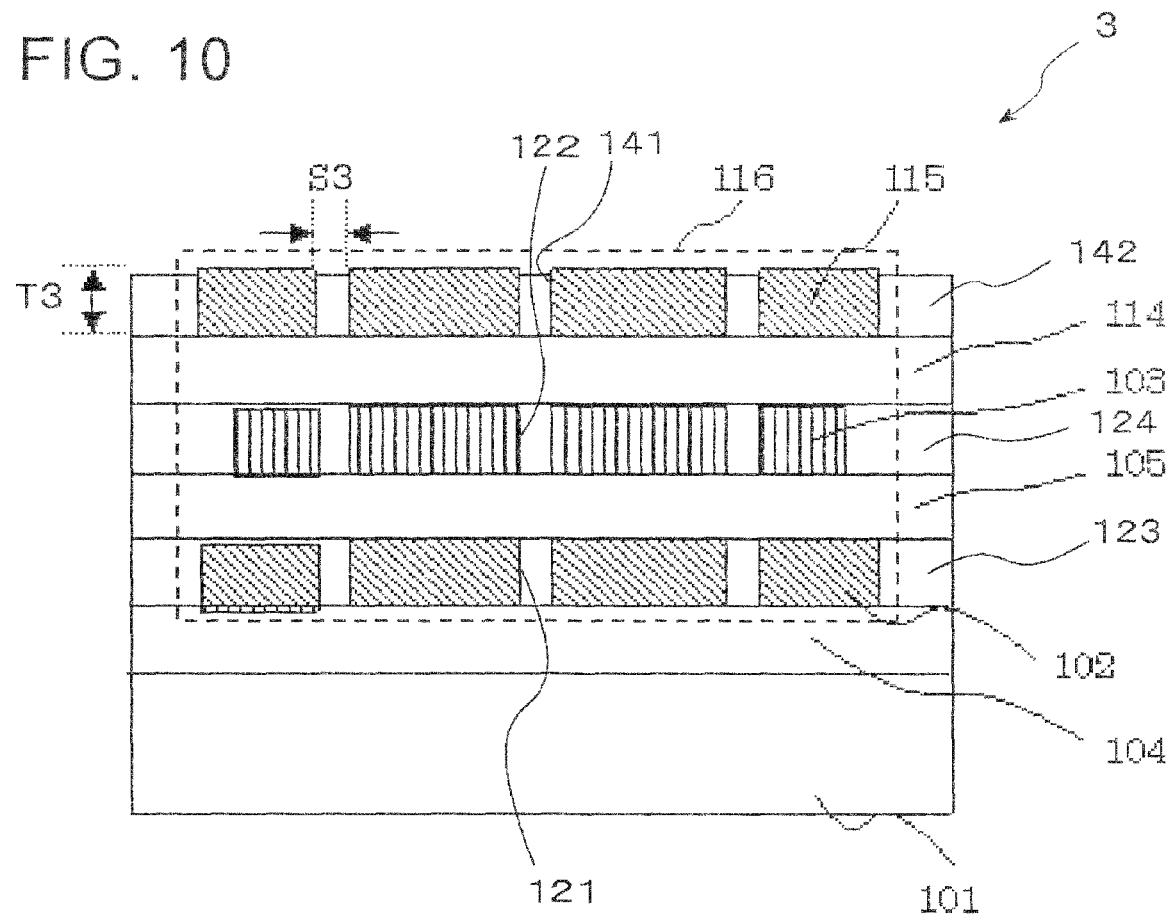
FIG. 10 is a cross-sectional view, illustrating third embodiment of a semiconductor device according to the present invention.

FIG. 10 is a cross-sectional view, illustrating third embodiment of a semiconductor device according to the present invention. A semiconductor device 3 includes:

a lower electrode 102 provided on a semiconductor substrate 101;

an insulating film 105, provided on the lower electrode 102 so as to be in contact with the lower electrode 102;

an upper electrode 103, provided on the insulating film 105 so as to be in contact with the insulating film 105;

a opening portion 121, provided in the lower electrode 102 and extending through the lower electrode 102; and a opening portion 122, provided in the upper electrode 103 and extending through the upper electrode 103.

Further, the semiconductor device 3 includes:

an insulating film 114 (second capacitive film), provided on the upper electrode 103 so as to be in contact with the upper electrode 103;

an electrode 115 (third electrode), provided on the insulating film 114 so as to be in contact with the insulating film 114; and a opening portion 141 (third opening portion), provided in the electrode 115 and extending through the electrode 115.

An insulating film 104, an insulating film 123, the insulating film 105, an insulating film 124, the insulating film 114 and the insulating film 142 are sequentially deposited on the semiconductor substrate 101. A silicon dioxide ($SiO_2$) film may be, for example, employed for the insulating films 114 and 142. The electrode 115 is formed in the insulating film 142. The electrode 115 is formed as a metallic film such as Cu film or the like. The electrode 115 may be formed via, for example, a damascene process. The insulating film 142 is embedded in the opening portion 141 that is provided in the electrode 115.

The electrode 115 is flat plate-shaped, which is in parallel with the lower electrode 102 and the upper electrode 103. The electrode 115, together with the upper electrode 103 and the insulating film 114, constitutes a MIM capacitor. In the capacitor element 116 of the semiconductor device 3, the MIM capacitance composed of the lower electrode 102, the upper electrode 103 and the insulating film 105 is coupled with the MIM capacitance composed of the electrode 115, the upper electrode 103 and the insulating film 114 in parallel. More specifically, the electrode 115 also functions as a lower electrode, similarly as the lower electrode 102.

The opening portion 141 is slit-shaped in plan view, similarly as the opening portion 121 and the opening portion 122. In particular in the present embodiment, the opening portion 121, the opening portion 122 and the opening portion 141 are identical in terms of geometry, dimension and position. Here, it is preferable that a width S3 of the opening portion 141 is equal to or shorter than a thickness T3 of the electrode 115. The rest of elements in the configuration of the semiconductor device 3 is similar to that of the semiconductor device 1.

The semiconductor device 3 having such configuration is capable of providing advantageous effects described below, in addition to the advantageous effects described above in reference to the semiconductor device 1. In the semiconductor device 3, both of the lower electrode 102 and the electrode 115 function as a lower electrode. This configuration provides a configuration, in which the MIM capacitance between the lower electrode 102 and the upper electrode 103 is coupled to the MIM capacitance between the upper electrode 103 and the electrode 115 in parallel, thereby achieving an increased capacitance value per unit area. Even in such case, by having the slit width S to be equal to or smaller than the thickness of the electrode, the MIM capacitance, which is suitable in providing a prevention of an influence by a dishing and a reduction in variation of capacitance value resulting from geometric variation, can be achieved.

Figure 11:
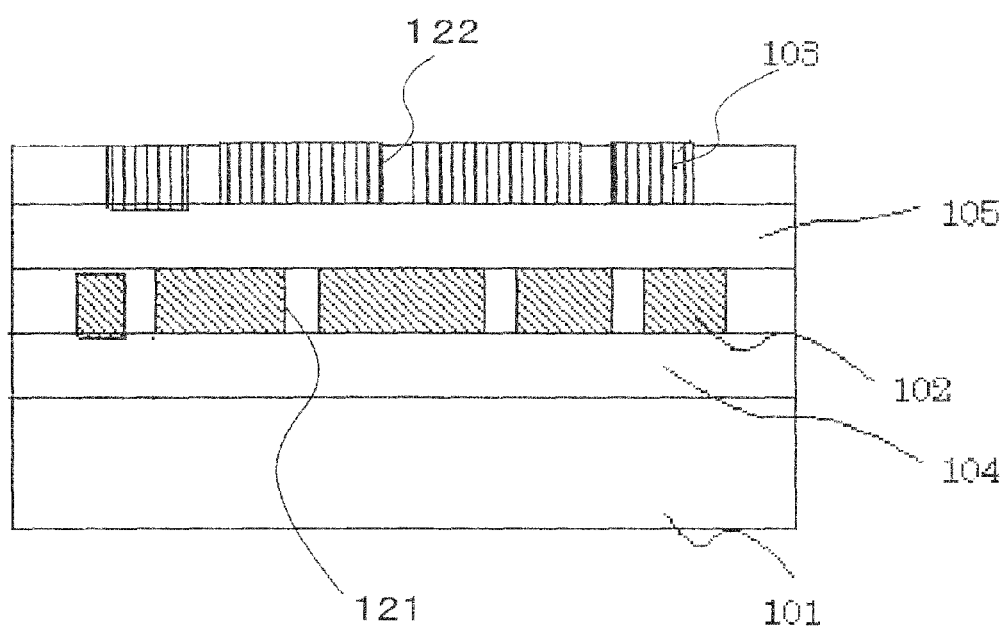
FIG. 11 is a cross-sectional view, illustrating a modified embodiment of a semiconductor device according to an embodiment.
Figure 12:
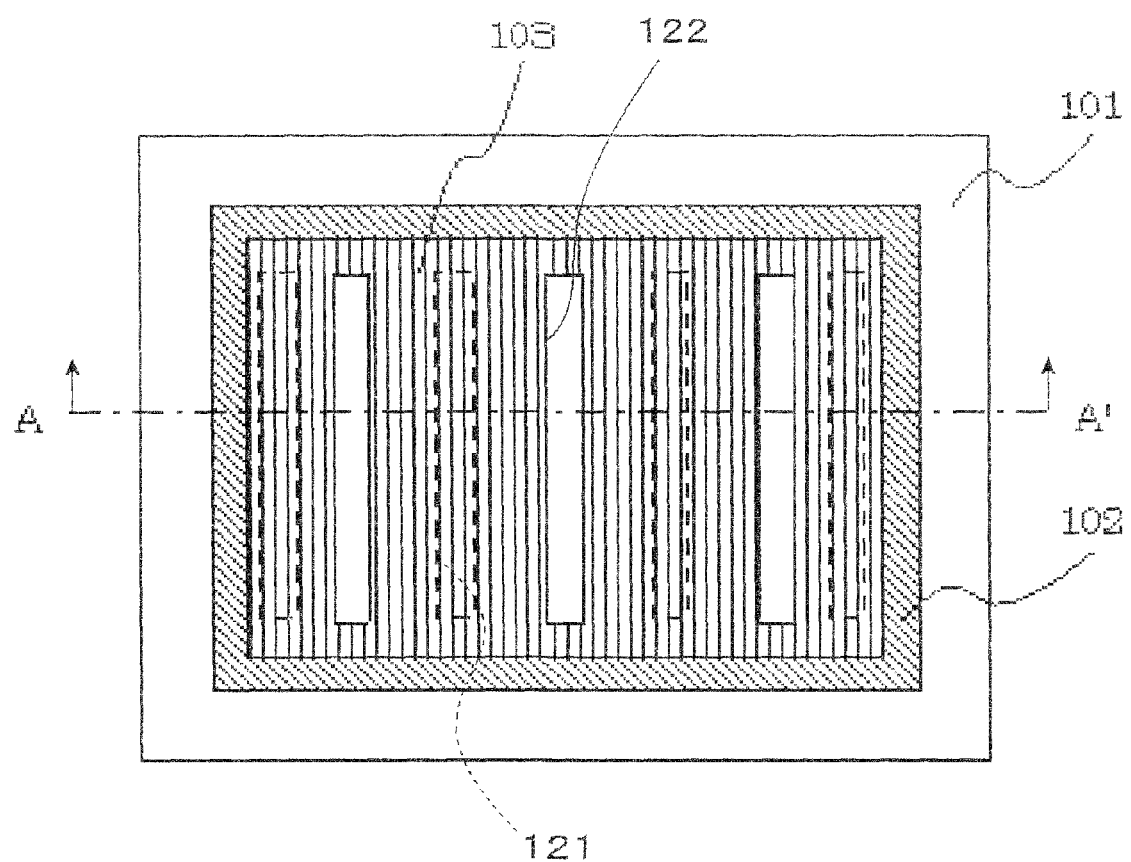
FIG. 12 is a plan view of the semiconductor device of FIG. 11.

While the preferred embodiments of the present invention have been described above in reference to the annexed figures, it should be understood that the disclosures above are presented for the purpose of illustrating the present invention only, and various modifications other than the above described configurations can also be adopted. For example, as shown in FIG. 11, the opening portion 121 and the opening portion 122 may be provided in different positions in plan view. A plan view of the semiconductor device of FIG. 11 is shown in FIG. 12. A cross section along line A-A' of FIG. 12 corresponds to the cross sectional view of FIG. 11.

Figure 13:
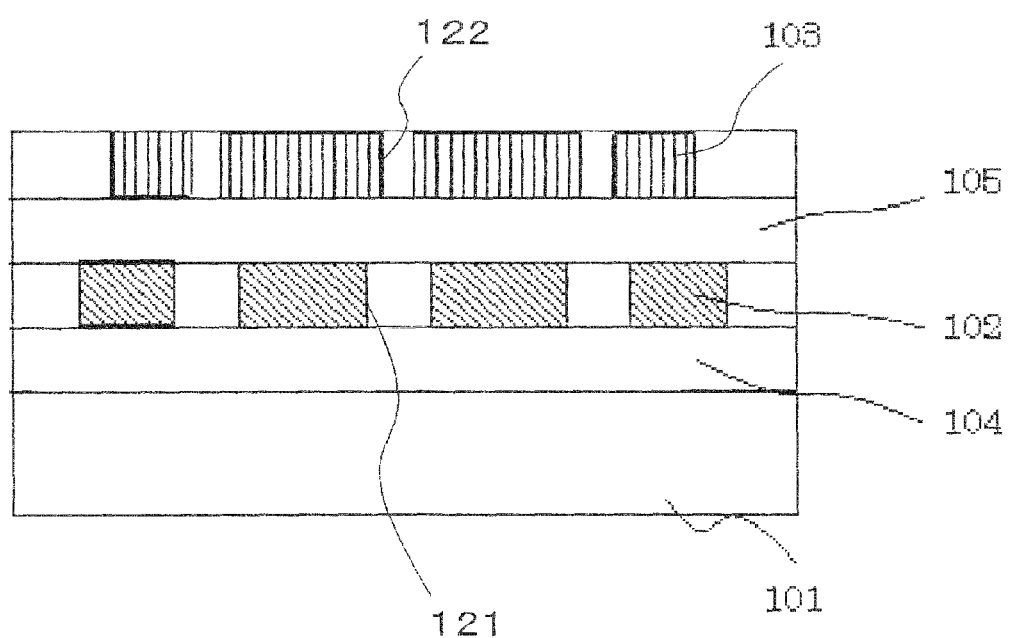
FIG. 13 is a cross-sectional view, illustrating other modified embodiment of a semiconductor device according to an embodiment.
Figure 14:
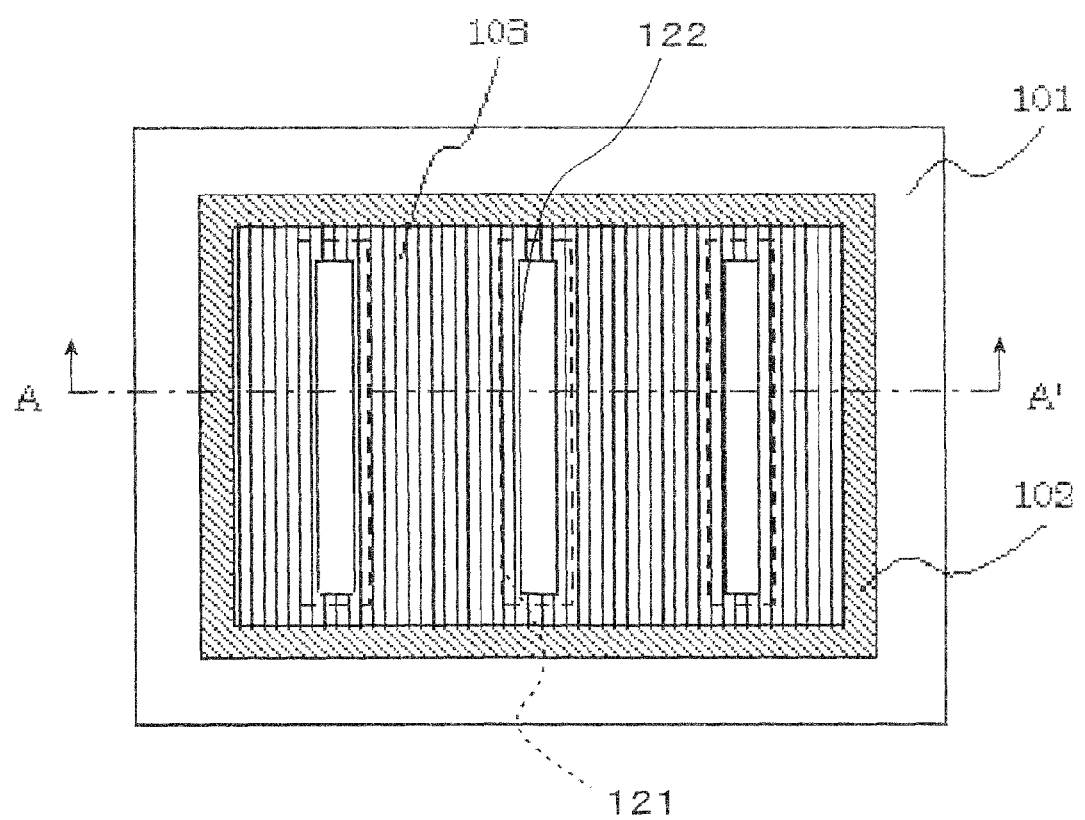
FIG. 14 is a plan view of the semiconductor device of FIG. 13.

As shown in FIG. 13, the opening portion 121 may have a dimension in plan view that is different from a dimension of the opening portion 122. A plan view of the semiconductor device of FIG. 13 is shown in FIG. 14. A cross section along line A-A' of FIG. 14 corresponds to the cross sectional view of FIG. 13.

Figure 15:
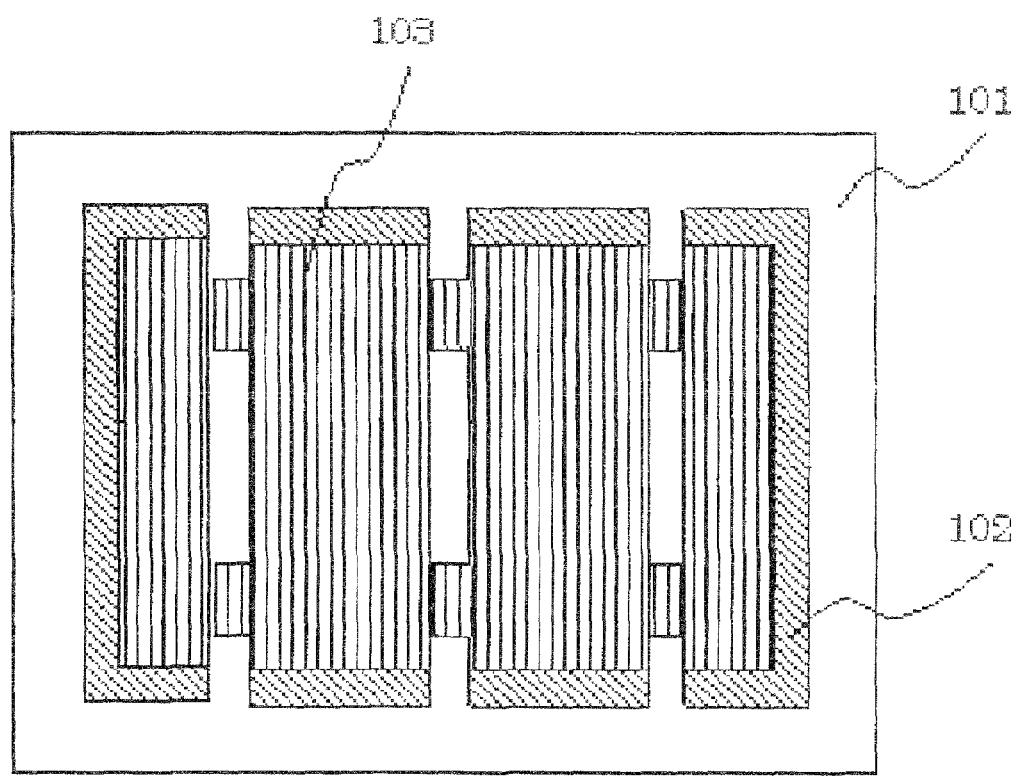
FIG. 15 is a plan view, illustrating other modified embodiment of a semiconductor device according to an embodiment.

As shown in FIG. 15, the lower electrode 102 and the upper electrode 103 may be ladder-shaped in plan view.

Figure 16:
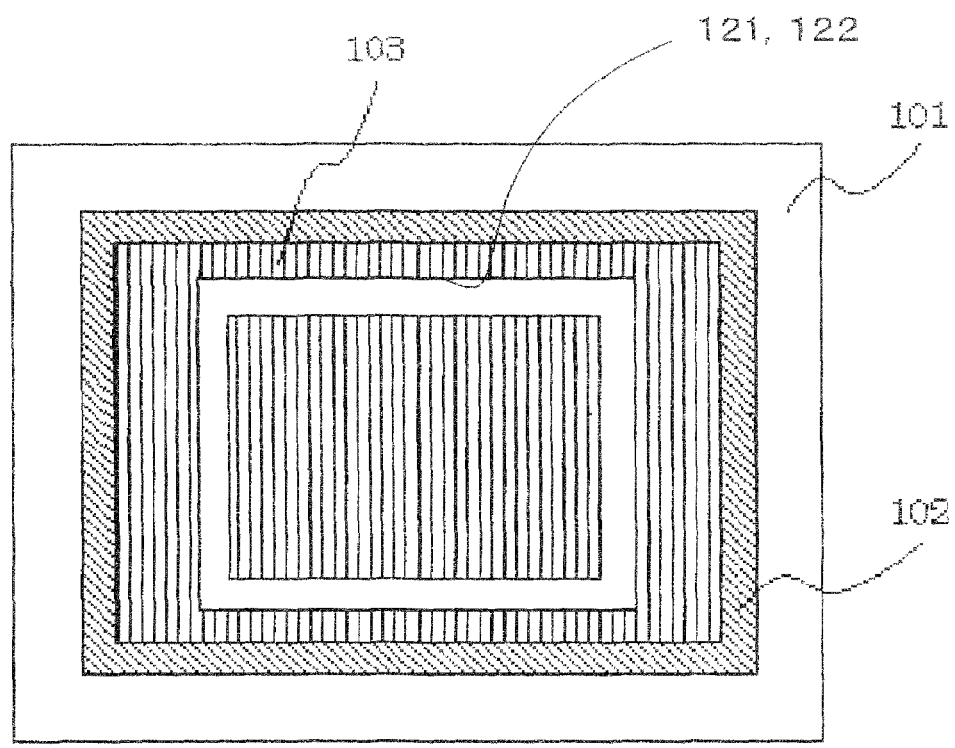
FIG. 16 is a plan view, illustrating other modified embodiment of a semiconductor device according to an embodiment.

As shown in FIG. 16, the opening portion 121 and the opening portion 122, may be annular-shaped in plan view.

Figure 17:
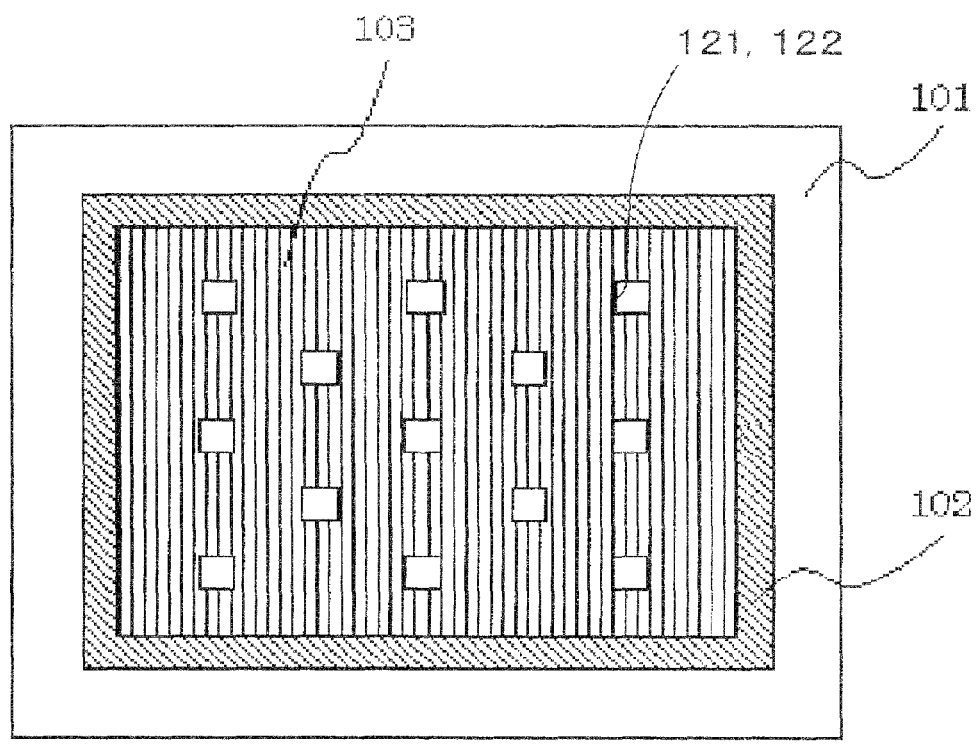
FIG. 17 is a plan view, illustrating other modified embodiment of a semiconductor device according to an embodiment.
Figure 18:
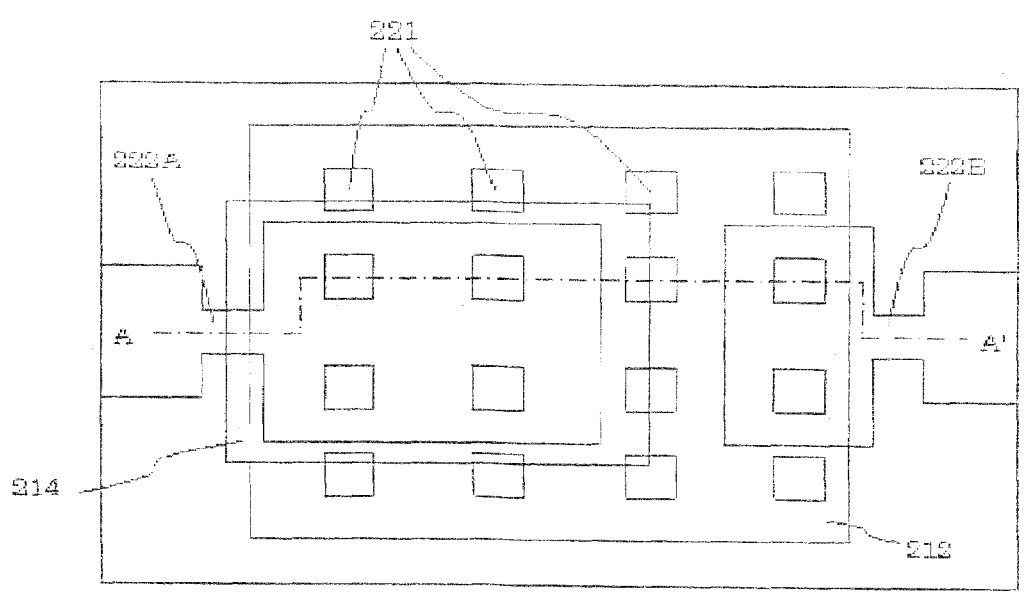
FIG. 18 is a plan view, illustrating a conventional semiconductor device.
Figure 19:
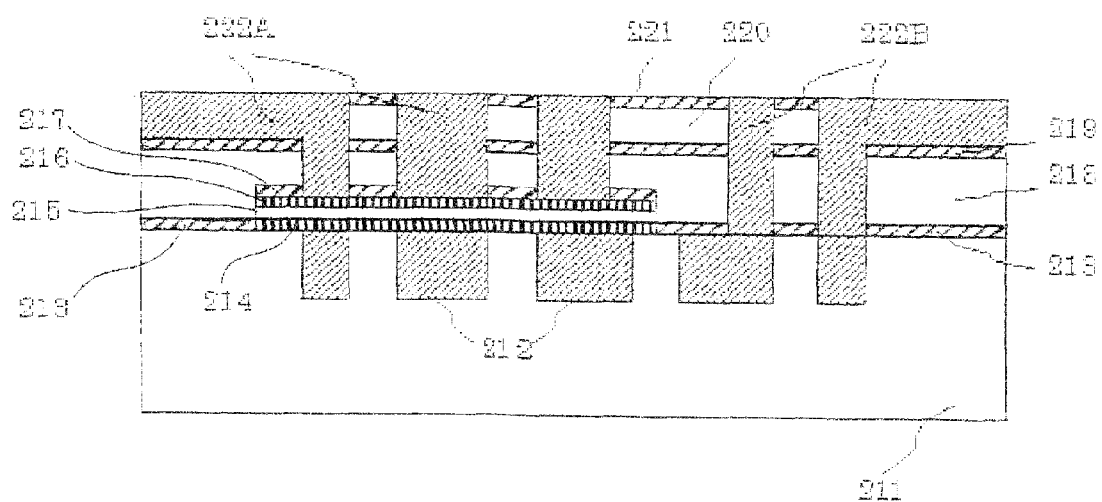
FIG. 19 is a plan view of the semiconductor device of FIG. 18.

As shown in FIG. 17, a plurality of opening portions 121 and a plurality of opening portions 122 may be provided, and are arranged to form a lattice pattern in plan view. In this exemplary implementation, a plurality of opening portions 121 (opening portions 122) are arranged to form a diagonal lattice pattern.

It is apparent that the present invention is not limited to the above embodiment, and may be modified and changed without departing from the scope and spirit of the invention.

What is claimed is:

1. A semiconductor device, comprising:
a first electrode provided on a semiconductor substrate;
a capacitive film, provided on said first electrode so as to be in contact with the first electrode;
a second electrode, provided on said capacitive film so as to be in contact with the capacitive film, said second electrode, said first electrode and said capacitive film constituting a capacitor element;
a first opening portion, provided in said first electrode and extending through the first electrode; and
a second opening portion, provided in said second electrode and extending through the second electrode, wherein insulating films are embedded within said first opening portion and said second opening portion, wherein a width of said first opening portion is equal to or shorter than a thickness of said first electrode and a width of said second opening portion is equal to or shorter than a thickness of said second electrode, and wherein an orthogonal projection of said first opening portion to a plane that is parallel to a substrate surface of said semiconductor substrate is identical with an orthogonal projection of said second opening portion to said plane.

2. The semiconductor device according to claim 1, wherein said first opening portion and said second opening portion are slit-shaped in plan view.

3. The semiconductor device according to claim 1, wherein a plurality of said first opening portions and a plurality of said second opening portions are provided, and are arranged to form a lattice pattern in plan view.

* * * * *